United States Patent [19]
Mori et al.

[11] Patent Number: 5,804,454
[45] Date of Patent: *Sep. 8, 1998

[54] INSULATION FILM-FORMING METHOD FOR SEMICONDUCTOR DEVICE MANUFACTURING WHEREIN SIOX ($0 \leq X \leq 1.8$) IS EVAPORATED

[75] Inventors: Hiroshi Mori; Toshiyuki Sameshima, both of Kanagawa, Japan

[73] Assignee: Sony Corporation, Tokyo, Japan

[*] Notice: The terminal 10 months of this patent has been disclaimed.

[21] Appl. No.: 451,675

[22] Filed: May 26, 1995

[30] Foreign Application Priority Data

Jun. 9, 1994 [JP] Japan .................................. 6-151507

[51] Int. Cl.⁶ .................................. H01L 21/316
[52] U.S. Cl. .................. 437/40; 437/41; 437/238; 437/978
[58] Field of Search .................. 437/238, 40, 41, 437/978; 427/568, 585, 588, 574, 579, 99, 255.3, 255.7; 148/DIG. 118, DIG. 43; 118/726

[56] References Cited

U.S. PATENT DOCUMENTS

| | | | |
|---|---|---|---|
| 3,926,508 | 12/1975 | Harmsen et al. | 350/296 |
| 3,991,234 | 11/1976 | Chang et al. | 427/164 |
| 4,052,520 | 10/1977 | Chang et al. | 427/164 |
| 4,061,800 | 12/1977 | Anderson | 427/36 |
| 4,624,859 | 11/1986 | Akira et al. | 437/238 |
| 5,085,904 | 2/1992 | Deak et al. | 428/35.7 |
| 5,302,208 | 4/1994 | Grimm et al. | 118/718 |

FOREIGN PATENT DOCUMENTS 06330290  11/1994  Japan .................................. 427/588

OTHER PUBLICATIONS

Wolf, Stanley "Silicon Processing for the VLSI Era", vol. 2, pp. 188–199.

*Primary Examiner*—Tuan H. Nguyen
*Assistant Examiner*—Matthew Whipple
*Attorney, Agent, or Firm*—Hill, Steadman & Simpson

[57] ABSTRACT

An insulation film-forming method comprising the steps of:
(A-1) heating and evaporating silicon raw materials comprising SiOx (provided that $0 \leq X \leq 1.8$);
(A-2) vapor phase reacting the evaporated silicon raw materials and a gas including oxygen, and generating silicon dioxide;
(A-3) adhering the silicon dioxide to a substrate surface, and forming a first insulation film comprising silicon dioxide on the surface substrate; and
(B) forming a second insulation film comprising silicon dioxide on the first insulation film by a chemical vapor phase growth technique or sputter technique.

6 Claims, 11 Drawing Sheets

INSULATION FILM-FORMING METHOD FOR SEMICONDUCTOR DEVICE MANUFACTURING WHEREIN SIOX (0≤X≤1.8) IS EVAPORATED

BACKGROUND OF THE INVENTION

1. Field Of The Invention

The present invention relates to a semiconductor device employing an insulation film formed based on an insulation film-forming method and a manufacturing method of a semiconductor device employing this forming method.

2. Description Of Related Art

Conventionally, gate insulation films comprising $SiO_2$ used in the construction of MOS-type transistors are formed by thermally oxidizing a silicon semiconductor substrate. Insulation films comprising $SiO_2$ formed by thermal oxidation techniques have extremely preferable surface boundary techniques i.e. low surface boundary level density and are a foundation of current semiconductor device manufacturing processes. Alternatively, an insulation film or inter-layer insulation film comprising $SiO_2$ may be formed by a thermal chemical vapor deposition technique (thermal CVD technique).

While, on the one hand, gate insulation films, insulation films or inter-layer insulation films (hereinafter, these may also be given the name "insulation films, etc.") comprising $SiO_2$ formed by thermal oxidation or thermal CVD techniques posses superior electrical characteristics, the film-forming temperature is extremely high. i.e. in thermal oxidation, heating a silicon semiconductor substrate temperature of 1000° C. or more is necessary while with thermal CVD techniques, heating a silicon semiconductor substrate to a temperature of 600° C. or more is necessary.

Therefore, when making semiconductor devices where low temperature processes depending on the materials used are applied in the manufacturing of thin-film transistors etc. made on glass substrates, these thermal oxidation techniques and thermal CVD techniques are not appropriate.

On the other hand, plasma CVD techniques may be used as a method of forming insulation films etc. comprising $SiO_2$ at low temperatures. In these plasma CVD techniques, $SiO_2$ generated by breaking down $SiH_4$, $N_2O$ or $O_2$ gas using RF discharge is piled onto the surface of a board comprising, for example, a glass substrate. The piling of an insulation film or the like comprising $SiO_2$ onto the surface of a board at temperatures of 300° C. or less is possible with these plasma CVD techniques. However, high-energy plasma is generated during film-forming with these plasma CVD techniques. The material which the board is made up of, for example, silicon, therefore incurs damage due to the high energy plasma while a gate insulation film comprising $SiO_2$ is being formed and the manufacturing of a transistor having desirable current/voltage characteristics is no longer possible.

SUMMARY OF THE INVENTION

It is therefore an object of the present invention to provide an insulation film-forming method capable of forming an insulation film possessing superior characteristics and a semiconductor device employing this insulation film.

Therefore, according to the present invention, an insulation film-forming method comprises the steps of:

(A-1) heating and evaporating silicon raw materials comprising SiOx (provided that 0≤X≤1.8);

(A-2) vapor phase reacting the evaporated silicon raw materials and a gas including oxygen, and generating silicon dioxide;

(A-3) adhering the silicon dioxide to a substrate surface, and forming a first insulation film comprising silicon dioxide on the surface substrate; and (B) forming a second insulation film comprising silicon dioxide on the first insulation film by a chemical vapor phase growth technique or sputter technique.

In this film-forming method, the partial pressure of the gas including oxygen may be from $1.3 \times 10^{-3}$ to 1.3 Pa and the temperature of the substrate when the first insulation film is formed may be from 0° to 900° C. Further, the chemical vapor phase growth technique may be a plasma CVD technique or a remote plasma technique and the temperature of the substrate when the second insulation film is formed may be from 0° to 450° C. The chemical vapor phase growth technique may be an ECR plasma CVD technique or a remote ECR plasma CVD technique and the temperature of the substrate when the second insulation film is formed may be from 0° to 450° C.

Further, according to the present invention, in a semiconductor device manufacturing method, a gate insulation film, insulation film or interlayer insulation film may be formed using the aforementioned film-forming method.

Moreover, according to the present invention, a semiconductor device may be characterized by using a two layer insulation film formed by the aforementioned insulation film-forming method as a gate insulation film, insulation film, or interlayer insulation film.

In the present invention, a first insulation film and a second insulation film comprising silicon dioxide are formed using two stages, a first insulation film-forming step and a second insulation film-forming step. The surface boundary level density (fault density) of a first insulation film formed by this firs insulation film-forming step is low and a MOS type transistor or thin-film transistor employing this film as a gate insulation film will have a low threshold voltage and a large degree of carrier shifting. However, this first insulation film has a low voltage resistance when compared with SiO2 films formed by plasma CVD techniques. Therefore, in the present invention, a second insulation film is formed on the first insulation film, with this second insulation film having a high voltage resistance. An insulation film made from the first insulation film and the second insulation film will therefore have a low surface boundary level density (fault density), few charge traps and a high voltage resistance.

The first insulation film is formed by generating silicon dioxide by vapor phase reacting evaporated silicon raw materials and a gas including oxygen and adhering the silicon dioxide to the surface of a board. The board temperature may therefore be set up appropriately depending on the heat resistance of the material making up the board. A first insulation film having superior characteristics may therefore be formed on a board comprising a material, such as glass, having a comparatively low melting point. Further, as the first insulation film is formed without using a high energy plasma etc., damage to the board can be avoided.

As a first insulation film is already formed on the board while the second insulation film is being formed, damage to the board is prevented even if the second insulation film is formed by, for example, plasma CVD or ECR plasma CVD techniques. Further, a low temperature can be adopted as the board temperature by adopting a plasma CVD or ECR plasma CVD technique and a the board temperature can be made to be an even lower temperature by adopting remote plasma CVD or remote ECR plasma CVD techniques.

If silicon monoxide (SiO) of a low melting point is employed as the silicon raw materials the silicon raw

DETAILED DESCRIPTION OF THE PREFERRED EMBODIMENTS

The following is a description, with reference to the drawings, of the present invention based on the embodiments.

First Embodiment

In the first embodiment, the characteristics of a first insulation film formed using a first insulation film-forming process of an insulation film forming process of the present invention are evaluated. Also, the first insulation film is formed on a substrate comprised of a silicon semiconductor substrate. Evaluation of the characteristics of the first insulation film are carried out by making and investigating the C-V characteristics (Capacitance-Voltage characteristics) of a MOS capacitor.

Figure 1:
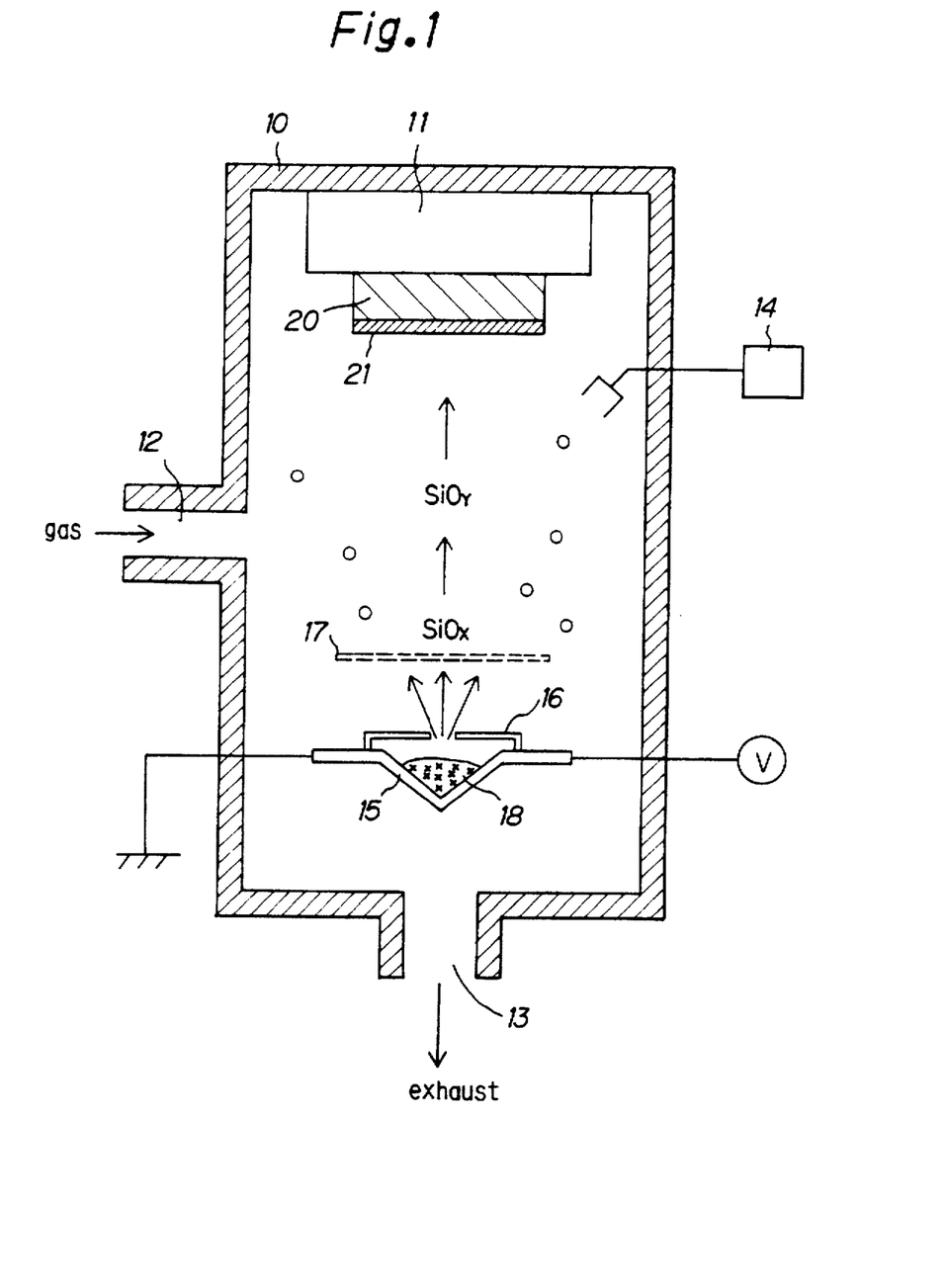
FIG. 1 is a view showing an outline of a film-forming device used in a first embodiment of the present invention.

An outline of a film-making device used in the first embodiment is shown in FIG. 1. The film-making device is comprised of a vacuum chamber 10, a substrate support 11, a gas inlet 12 for introducing gas including oxygen into the vacuum chamber 10, a gas exhaust 13, a metallic boat 15, and a shutter 17, etc. A heater for heating the substrate 20 to the desired temperature is also incorporated within the substrate support 11, although this is not shown in the drawings. When the metallic boat 15 is heated so that silicon raw materials 18 housed within the metallic boat 15 evaporate and come out of the metallic boat 15, there is a cover 16 made of Ta with a through-hole 0.5 mm in diameter covering the metallic boat 15.

If an electric current is made to flow through the metallic boat 15 made of Ta positioned within the vacuum chamber 10, the silicon raw materials 18 comprised of fine powder silicon monoxide (SiO) housed within the metallic boat 15 is heated and the silicon raw materials 18 evaporate. The board 20 comprised of a silicon semiconductor substrate on which it is intended to form a first insulation film is positioned 10 cm away from the metallic boat 15 and a shutter 17 is provided between the metallic boat 15 and the board 20. An exhaust pump not shown in the drawings provides ventilation within the vacuum chamber 10 from the gas exhaust 13. Reference numeral 14 is an evaporation speed measuring device equipped with, for example, a liquid crystal oscillator.

With the shutter 17 closed (the state of the shutter 17 is shown by the dotted lines in FIG. 1), the pressure within the vacuum chamber 10 is taken to be $1.3 \times 10^{-4}$ Pa ($1 \times 10^{-6}$ torr), a current is made to flow at the metallic boat 15, the silicon raw materials 18 are heated to an extent where evaporation does not occur and moisture having adsorbed the silicon raw materials 18 is given off as gas. After this, the metallic boat 15 is temporarily cooled and, using oxygen gas as the gas including oxygen, oxygen gas is introduced into the vacuum chamber 10 via the gas inlet 12 to give an oxygen gas partial pressure within the chamber 10 of $1.3 \times 10^{-2}$ Pa ($1 \times 10^{-4}$ torr). The board 20, however, is maintained at a normal temperature. Further, rather than introduce oxygen gas into the vacuum chamber 10, a suitable amount of air may be allowed to remain in the vacuum chamber 10 and the pressure of the vacuum chamber 10 may be controlled so that the partial pressure of the oxygen within the remaining air is of the desired pressure.

A current is then made to flow at the metallic boat 15, the shutter 17 is opened and the silicon raw materials 18 comprised of SiO evaporate in such a manner that a first insulation film 21 comprised of SiOy is formed at a rate of 10 nm/min on the board 20. The silicon raw materials comprised of evaporated SiO and the gas including oxygen vapor phase react and silicon dioxide ($SiO_y$, provided that $1.9 \leq Y \leq 2.0$) is generated. The $SiO_y$ generated adheres to the surface of the board 20 and the first insulation film 21 made of $SiO_y$ is formed on the surface of the board 20. In the following description, the method for forming the first insulation film 21 is also referred to as the evaporation method.

The refractive index of the first insulation film 21 made of SiOY to a thickness of 70 nm is 1.46 to 1.47, the same value as for SiO2 films formed by thermal oxidation techniques.

Figure 2A:
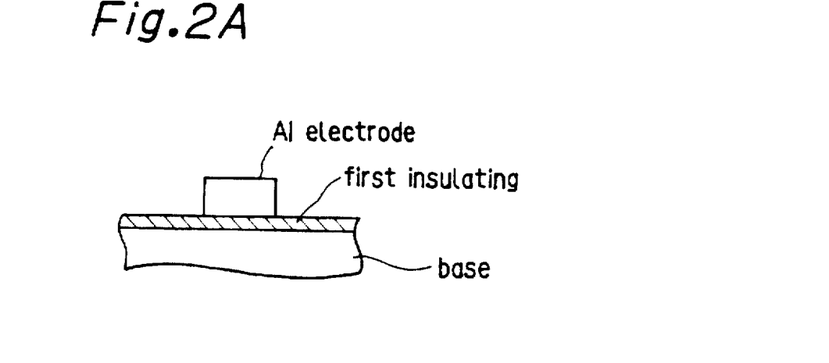
FIG. 2 shows a schematic cross-sectional view of a part of an Al gate MOS capacitor made for testing the first embodiment and a view of a C-V characteristic for the Al gate MOS capacitor.
Figure 2B:
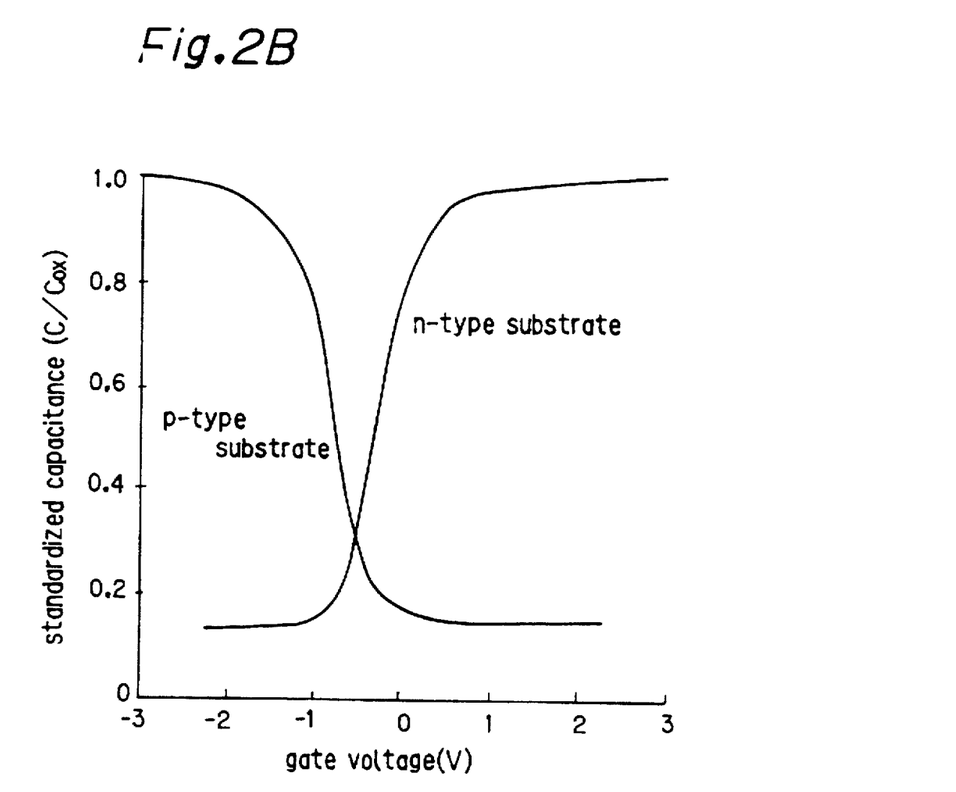

For experiment, an aluminium electrode was formed on this first insulation film 21 and an Al gate MOS capacitor was made. A schematic cross-sectional diagram of a part of this Al gate MOS capacitor is shown in FIG. 2(A). The C-V characteristics when a p-type silicon semiconductor substrate or an n-type silicon semiconductor substrate is used as the board 20 are shown in FIG. 2(B).

The chemical bond (for example, disconnections of Si—O or Si—OH) at the surface boundary between the board 20 made of a silicon semiconductor substrate and the first insulation film 21 and the fixed charge and surface boundary levels generated due to the shifting (injecting) of positive holes between the board and the first insulation film 21 can be evaluated by evaluating the C-V characteristics. The horizontal axis in FIG. 2(B) represents the voltage (in Volts) applied to the gate electrode and the vertical axis represents the standardized capacitance.

When the incline of the C-V characteristic is gentle, a large number of surface boundary levels are formed and a large amount of charge is trapped at the fault in the region of the surface boundary. If the obtained C-V characteristic has a steep incline, then it can be determined that the first insulation film obtained in the first embodiment has very few faults. The voltage resistance of the first insulation film is, however, 1.2 MV/cm, i.e. lower than the 4.5 MV/cm voltage resistance of an SiO2 film obtained using thermal oxidation or CVD techniques.

Second Embodiment

In a second embodiment, the characteristics of the first insulation film formed by the first insulation film forming process of the insulation film-forming method of the present invention are evaluated. Further, the first insulation film is formed on a substrate comprised of a poly silicon layer and finally, a thin-film transistor is made. The characteristics of the first insulation film are evaluated using the drain current/gate voltage characteristic. In the following, the manufacturing method for the thin-film transistor for use in evaluation is described with reference to FIG. 3.

[step 200]

A phosphorous or boron-doped hydrogenized amorphous silicon layer 31 is formed on a glass substrate 30 to a thickness of 20 nm using a common plasma CVD technique. A portion of the hydrogenized amorphous silicon layer 31 which is finally to form the channel region is then removed by photolithographic or etching technology (refer to FIG. 3(A).

[step 210]

Figure 3A:
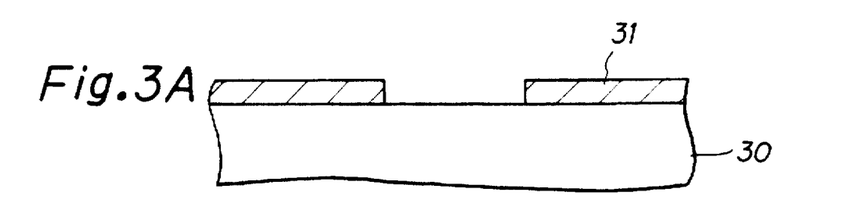
FIG. 3 is a schematic cross-sectional view of a board etc. at each manufacturing step for making a thin-film transistor for the purpose of testing a second embodiment.
Figure 3B:
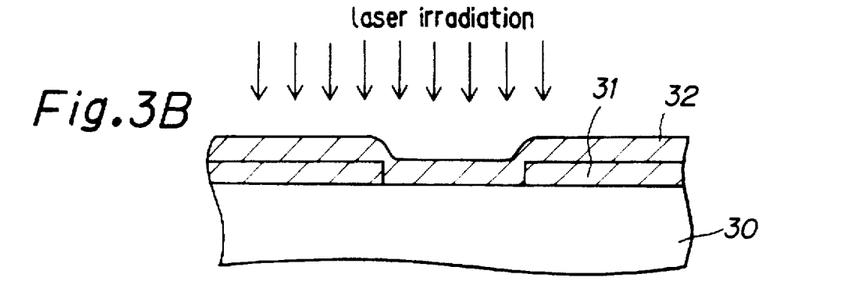
Figure 3C:
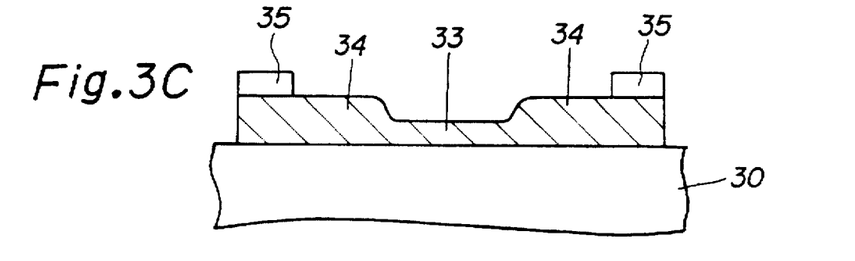

Next, a non-doped hydrogenized amorphous silicon layer 32 is formed to a thickness of 20 nm across the whole surface by a plasma CVD technique and the amorphous silicon layers 31 and 32 are then crystallized using an XeCl Excimer laser (refer to FIG. 3(B)). Then, a channel region 33 comprising a non-doped poly crystal silicon layer, and a source-drain region 34 comprising a doped poly crystal silicon layer are formed. After that, a hydrogen plasma process is carried out and the poly crystal silicon dangling bond is terminated by hydrogen adsorption so as to give a high-quality poly crystal silicon layer.

[step 220]

Aluminium is formed to a thickness of 50 nm over the whole surface by a sputtering technique and source and drain electrodes 35 are formed using photolithographic or etching technology. Next, so-called island patterning is carried out to remove regions other than the transistor-forming regions of the poly-crystal silicon layer (refer to FIG. 3(C)).

Figure 3D:
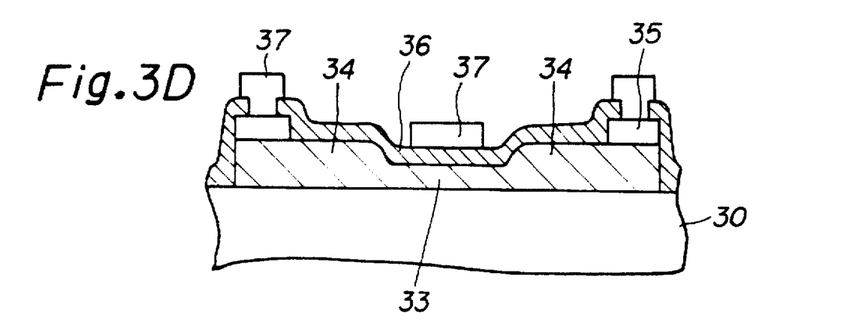

Then, using a method similar to that of the first embodiment, a first insulation film 36 if thickness 20 nm comprising SiO$_y$ is formed as a gate insulation film (gate oxidation layer) on the surface of the board comprised of a poly crystal silicon layer. After this, holes are formed in the first insulation film 36 above the source/drain electrodes 35. Aluminium is then formed to a thickness of 100 nm over the whole surface by a sputtering technique and gate electrodes 37 and wiring 38 are formed using photolithographic or etching techniques. In this way, a poly crystal silicon thin-film transistor for evaluating the characteristics of the first insulation film is obtained, as shown in FIG. 3(D).

Figure 4:
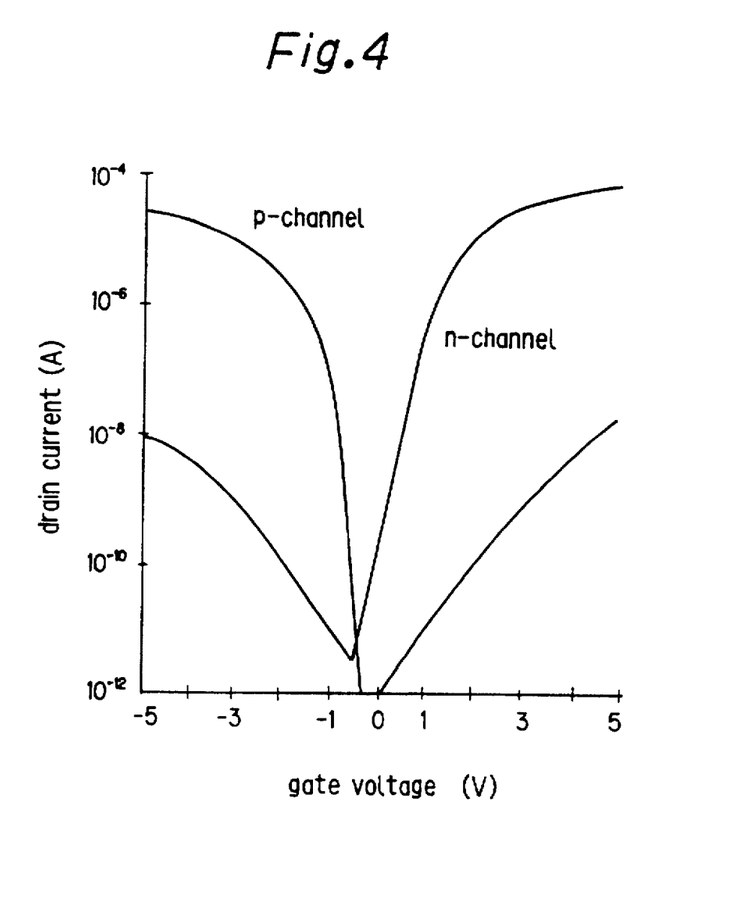
FIG. 4 is a view showing drain current/gate voltage characteristics of a poly crystal silicon thin-film transistor of the second embodiment.

The drain current/gate voltage characteristics of this poly crystal silicon thin-film transistor are shown in FIG. 4. A desirable drain current/gate voltage characteristic is obtained where a large drain current flows for a low gate voltage. Further, when estimating the surface boundary (energy) level density (fault density) at the surface boundary of the first insulation film 36 and the poly crystal silicon layer from the sub-threshold slope value a desirable value of $1.4 \times 10^{11}$ cm$^{-2}$eV$^{-1}$ is obtained.

The relationship between the drain current and the gate voltage occurring at the sub-threshold region is expressed by the following equation;

$$I_d = I_o \exp\{(qV_g)/(nk_BT)\}$$

for a charge q, gate voltage Vg, boltzmans constant ks and temperature T. Further, $I_o$ is a constant depending on the transistor dimensions, impurity concentration of the substrate, temperature and drain voltage. Still further, n is for a depletion layer capacitance $C_B$, a boundary surface level capacitor $C_{it}$ and a first insulation film capacitance $C_{OX}$ and is expressed by:

$$n=1+(C_B+C_{it})/C_{OX}$$

The gate voltage $S=dV_g/d\log_{10}I_d$ necessary in the increasing of the drain current in the sub-threshold region by a factor of ten is defined by the subthreshold coefficient. The sub-threshold coefficient S is the inverse number of the slope (threshold slope) of the straight line when the threshold characteristic is plotted in a $\log_{10}I_d$-$V_g$ plane. The threshold coefficient S can be defined from the above equation as:

$$S=n(k_BT/q) \ln 10$$

Therefore, using measurements obtained for the threshold coefficient S and the depletion layer capacitance $C_B$, the surface boundary level density Dit becomes;

$$D_{it}=(1/q)[\{(qS)/(k_BT \ln 10)\}C_{ox}-C_B]$$

The depletion layer capacitance $C_B$ can be measured from the relationship of the threshold voltage Vth with the substrate voltage Vsub and can be obtained from the following equation.

$$CB=-C_{ox}(dV_{th}/dV_{sub})$$

As can be determined from the results for the characteristic measurements in FIG. 2(B) and FIG. 4, superior characteristics can be obtained with few faults occurring at the surface boundary of the first insulation film and the substrate by form the first insulation film by evaporation techniques. However, the voltage resistance of the first insulation film formed by evaporation techniques is lower than the voltage resistance of SiO2 films obtained using thermal oxidation or thermal CVD techniques. In the insulation film-forming method of the present invention, in order to resolve this problem a second insulation film is formed using CVD or sputtering techniques on the first insulation film in order to improve the characteristics of the whole film comprising first and second insulation films.

Third Embodiment

In a third embodiment, the characteristics of a second insulation film formed by an insulation film-forming step, specifically, a remote plasma CVD technique, of an insulation film-forming method of the present invention are evaluated. Further, a second insulation film is formed on a board made of a silicon semiconductor substrate. In order to evaluate the characteristics of the second insulation film, a MOS capacitor is made and the C-V characteristics are investigated.

Figure 5:
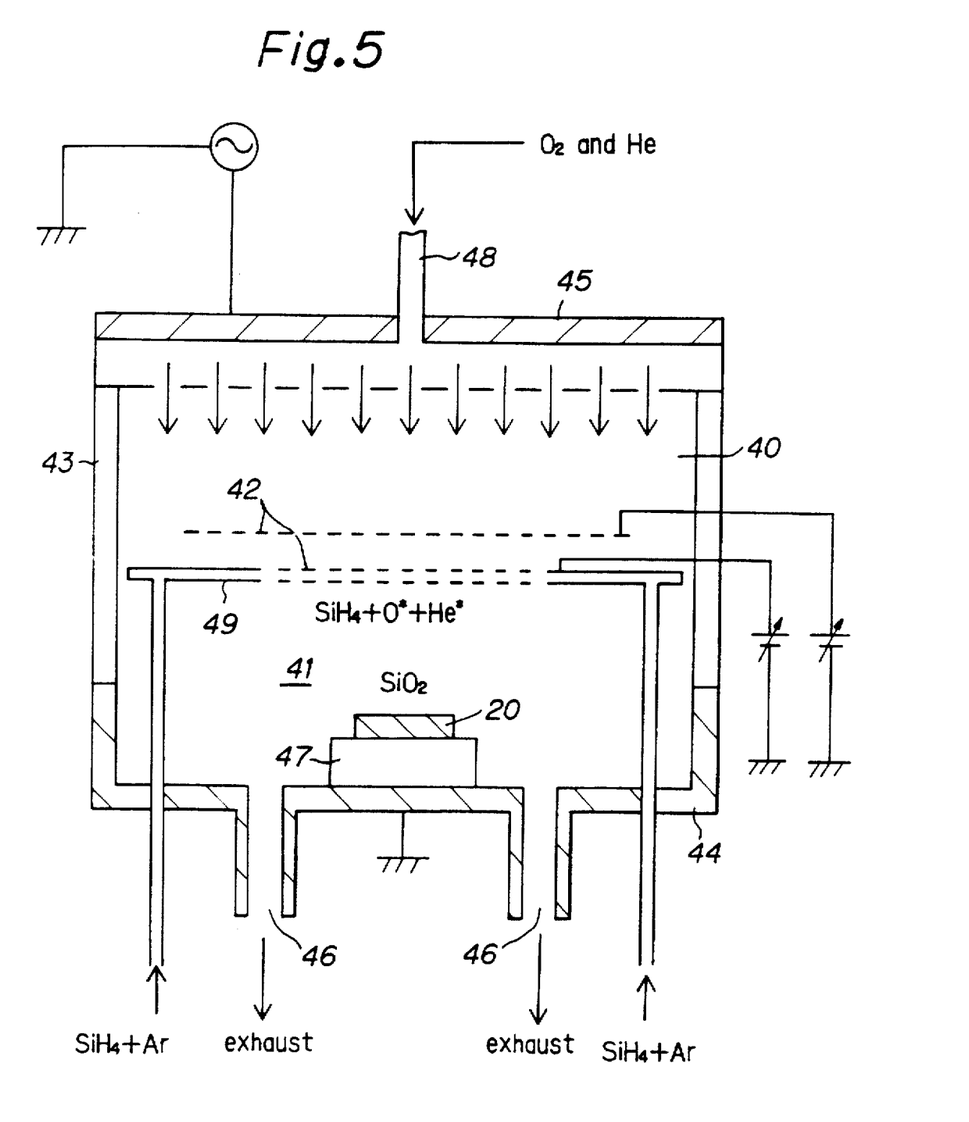
FIG. 5 is a view showing an outline of a remote plasma CVD device used in a third embodiment.

An outline of a remote plasma CVD device used in the third embodiment is shown in FIG. 5. The remote plasma CVD device is a parallel plate-type CVD device of a tri-electrode (triode) structure. The CVD device is separate from a plasma generating chamber 40 and the film-forming chamber 41, with a mesh electrode 42 having a multiplicity of openings being positioned between the plasma generating chamber 40 and the film-forming chamber 41.

The plasma generating chamber 40 and the film-forming chamber 41 are constructed from a glass tube 43. A spacing wall member 44 made from, for example, metal, is attached to the lower end of the glass tube 43. On the other hand, a disc-shaped upper electrode 45 made of metal is attached at the upper part of the glass tube 43. Within the glass tube 43, evacuation is carried out by an exhaust means not shown in the drawings from an exhaust 46 provided at the spacing wall member 44 and a prescribed degree of vacuum is maintained. A load support 47 for supporting the board 20 is provided at the lower part of the film-forming chamber 41. Further, a heater capable of heating and maintaining the board 20 at a prescribed temperature (not shown in the drawings) is provided at the load support 47.

A gas inlet 48 electrically insulated from the upper electrode 45 is provided, for example, at the center of the upper electrode 45. Gas for plasma generation is let-in via the gas inlet 48 and sent to the plasma generating chamber 40 from the lower face of the upper electrode 45 via a plurality of diverging pipes (not shown in the drawings. A film-forming material gas provider 49 is provided in the vicinity of the mesh electrode 42.

A 13.56 MHz RF voltage is applied across the upper electrode 45 and the mesh electrode 42 from the power supply and the load support 47 is connected to ground. Then, $O_2$ and He gas are introduced into the plasma generating chamber 40 from the gas inlet 48 so that a plasma gas discharge is generated within the plasma generating chamber 40. High-energy ions and electrons are confined between the upper electrode 45 and the mesh electrode 42 and find it difficult to flow into the film-forming chamber 41. On the other hand, neutral oxygen and helium radicals pass through the mesh electrode 42 and flow into the film-forming chamber 41. Then, $SiH_4$ introduced into the film-forming chamber 41 from the film-forming material gas provider 49 is decomposed and a second insulation layer comprising $SiO_2$ is formed on the substrate 20. An example of the film-forming condition for this second insulation film is as follows.

Gas used: SiH4/O2/He=1.2/5/110 sccm
RF power: 5 kW (13.56 MHz)
board temperature: 270° C.
Pressure: 0.003 Pa Rather than connecting the mesh electrode 42 to earth, charge particles can be controlled by applying an appropriate bias voltage. In this way, the occurrence of damage due to O2 ions etc. going to the board 20 can be suppressed.

Figure 6A:
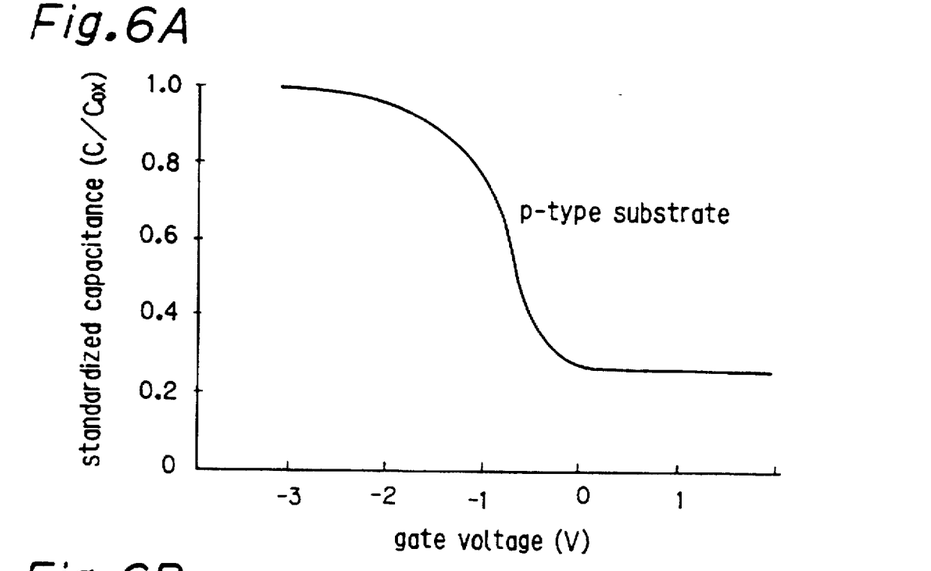
FIG. 6 is a view showing a C-V characteristic of an Al gate MOS capacitor made for testing a third embodiment and a drain current/gate voltage characteristic for a poly crystal silicon thin-film transistor of a fourth embodiment.

For testing, an aluminium electrode was formed on the second insulation layer and an Al gate MOS capacitor was made. The structure of the Al gate MOS capacitor was the same as the structure shown in FIG. 2(A). The C-V characteristics of the Al gate MOS capacitor for the case where a p-type silicon semiconductor substrate was used as the board 20 is shown in FIG. 6(A). As the incline of the obtained C-V characteristic is steep, it can be determined that the second insulation film obtained in this third embodiment is an insulation film having few faults. Further, the voltage resistance of the second insulation film is about 4.5 MV/cm, with this value being the same as the voltage resistance (about 4.5 MV/cm) of an SiO2 film obtained using thermal oxidation or thermal CVD techniques.

Fourth Embodiment

In a fourth embodiment, the characteristics of a second insulation film formed using the second insulation film-forming step of the insulation film-forming method of the present invention is evaluated using the same method as in the second embodiment. i.e. the second insulation film is formed on a board comprising a poly crystal silicon layer and finally, a thin-film transistor is made. Evaluation of the characteristics of the second insulation film is carried out using the drain current/gate voltage characteristics. The method of manufacturing the thin-film transistor for evaluation can be the same as for the second embodiment. However, in [step-230], a second insulation film of thickness 20 nm comprising of $SiO_2$ was formed on the surface of a board comprised of a poly crystal silicon layer as a gate insulation film using the same method as for the second embodiment.

Figure 6B:
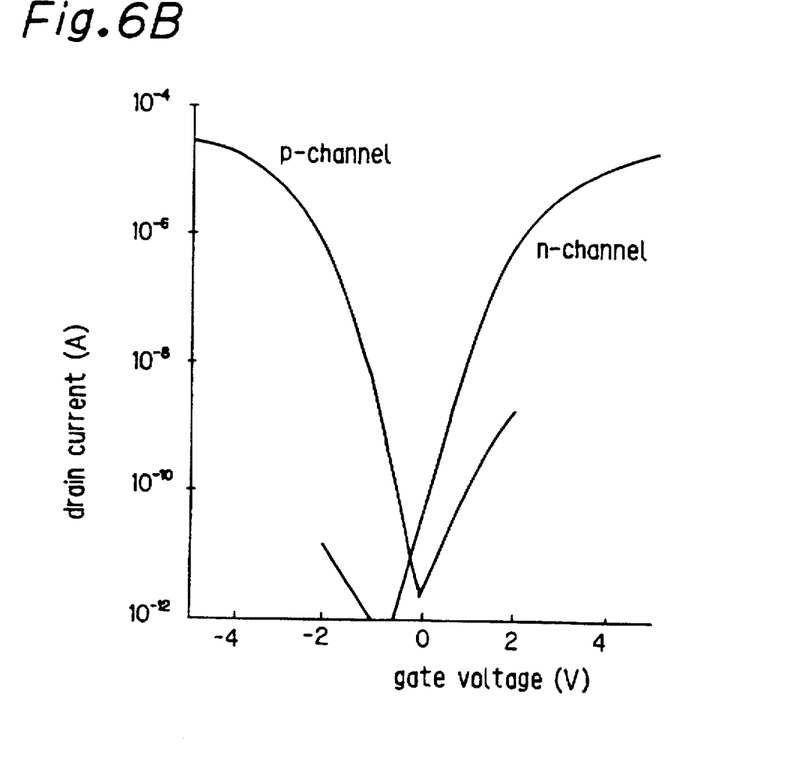

The drain current/gate voltage characteristics of this poly crystal silicon thin-film transistor are shown in FIG. 6(B). A desirable drain current/gate voltage characteristic is obtained where a large drain current flows for a low gate voltage. Further, a desirable value of $2.9 \times 10^{11}$ $cm^{-2}eV^{-1}$ is obtained for estimates of the surface boundary level density (fault density) at the surface boundary of the second insulation film and the board from the value of the sub-threshold slope. However, this is a higher value than the value ($1.4 \times 10^{11}$ $cm^{-2}eV^{-1}$) for the first insulation film formed by evapouration techniques. The board comprised of poly crystal silicon therefore incurs little damage because the second insulation film is formed by a remote plasma CVD technique and the damage occurring to the board is much less than for evaporation techniques.

It can be determined from the characteristic measurement results in FIG. 6(A) and (B), that superior characteristics are obtained with few faults occurring at the surface boundary of the second insulation film and the board by forming a second insulation film using remote plasma CVD techniques. However, the voltage resistance of the second insulation film is about the same as the voltage resistance of the SiO2 film obtained thermal oxidation or CVD techniques.

Fifth Embodiment

In a fifth embodiment, the insulation film-forming method of the present invention is applied to making a thin-film transistor. The thin-film transistor manufacturing steps of the fifth embodiment are described in the following with reference to FIG. 7.

[step-500]

A phosphorous or boron-doped hydrogenized amorphous silicon layer 31 is formed on a glass substrate 30 to a thickness of 20 nm using a common plasma CVD technique. A portion of the hydrogenized amorphous silicon layer 31 which is finally to form the channel region is then removed by photolithographic or etching technology (refer to FIG. 7(A)).

[step 510]

Figure 7A:
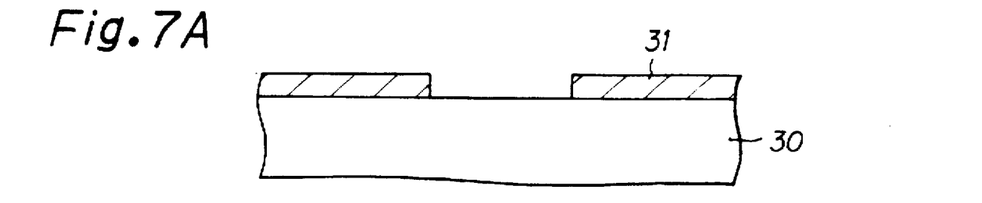
FIG. 7 is a schematic cross-sectional view of a part of a board etc. for describing manufacturing steps for a semiconductor device comprising a thin-film transistor.
Figure 7B:
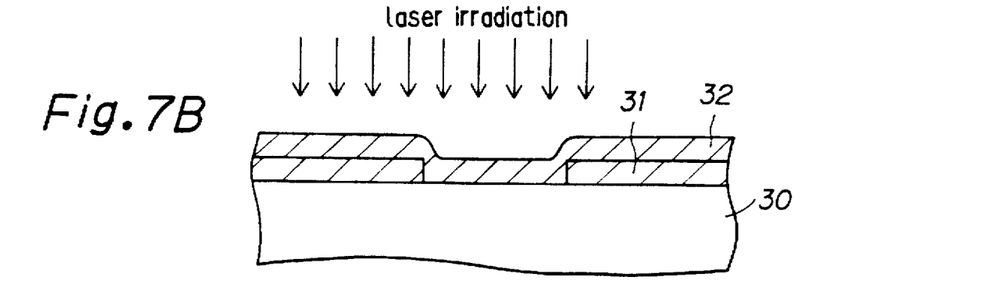
Figure 7C:
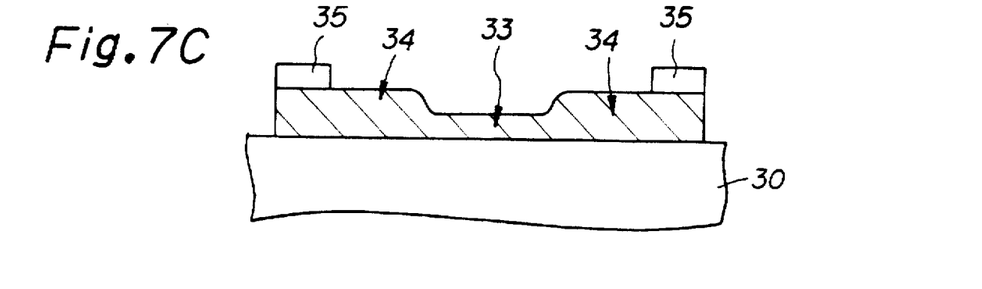

Next, a non-doped hydrogenized amorphous silicon layer 32 is formed to a thickness of 20 nm across the whole surface by a plasma CVD technique and the amorphous silicon layers 31 and 32 are then crystallized within a vacuum using an XeCl Excimer laser (refer to FIG. 7(B)). Then, a channel region 33 comprising a non-doped poly crystal silicon layer, and a source-drain region 34 comprising a doped poly crystal silicon layer are formed. After that, a hydrogen plasma process is carried out and the poly crystal silicon dangling bond is terminated by hydrogen adsorption so as to give a high-quality poly crystal silicon layer.

[step 520]

Aluminium is formed to a thickness of 50 nm over the whole surface by a sputtering technique and source and drain electrodes 35 are formed using photolithographic or etching technology. Next, so-called island patterning is carried out to remove regions other than the transistor-forming regions of the poly-crystal silicon layer (refer to FIG. 7(C)).

[step-530]

Figure 7D:
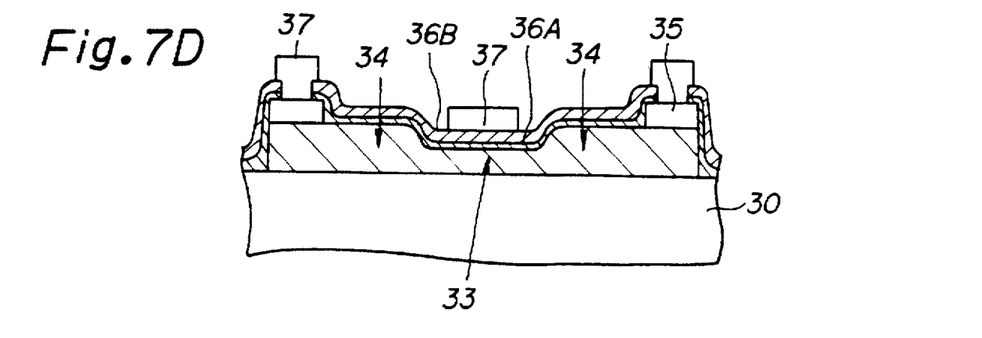

Next, using the same method as the first embodiment, a first insulation film 36A comprised of SiO$_Y$ is formed to a thickness of 50 nm on the surface of the board comprised of a poly silicon layer. Then, using the same method as in the third embodiment, a second insulation film 36B comprising SiO2 is formed to a thickness of 50 nm on the first insulation film 36A. These first and second insulation films 36A and 36B correspond to gate insulation films. After this, openings are formed in the first insulation film 36 above the source and drain electrodes 35. Aluminium is then formed to a thickness of 100 nm over the whole surface by a sputtering technique and gate electrodes 37 are formed using photolithography or etching technology. In this way, a poly crystal silicon thin-film transistor of the structure shown in FIG. 7(D) is obtained.

Sixth Embodiment

In a sixth embodiment, the insulation film-forming method of the present invention is applied to making a MOS-type transistor. In the following, a MOS-type transistor manufacturing step of the sixth embodiment is described with reference to FIG. 8.

[step-600]

An element isolation region 51 composed of a LOCOS structure is formed at a board 50 comprised of a silicon semiconductor substrate using a conventional method. A first insulation film 52A 50 nm thick comprised of SiOY is then formed on the surface of the board 50 using the same method as in the first embodiment. After this, a second insulation film 52B comprised of SiO2 is formed to a thickness of 50 nm on the first insulation film 52A using the same method as in the third embodiment (refer to FIG. 8(A)). An insulation film 52 comprised of these first and second insulation films 52A and 52B then corresponds to a gate insulation film.

[step-610]

After this, a polysilicon layer is formed over the whole surface using a CVD technique, this silicon layer is patterned using photolithography or dry etching technology and a gate electrode 53 comprised of polysilicon is formed. Next, impurity ions for forming an LDD structure are injected and a SiO$_2$ layer is overlaid over the entire surface using a CVD technique. The SiO2 layer is then etched and a gate sidewall 54 is formed at the sidewall of the gate electrode 53 (refer to FIG. 8(B)).

[step 620]

Figure 8A:
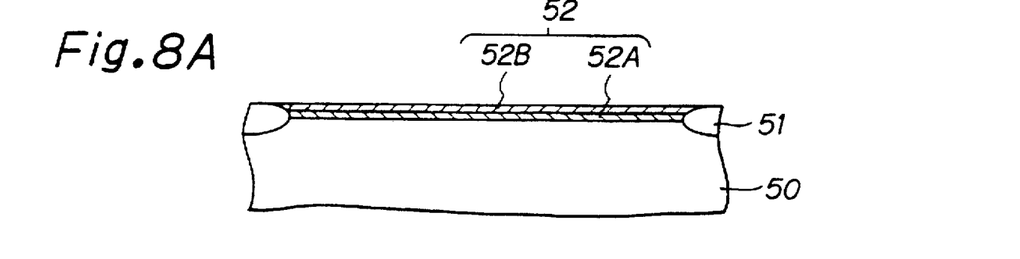
FIG. 8 is a schematic cross-sectional view of a part of a board etc. for describing manufacturing steps for a semiconductor device comprising a MOS-type transistor.
Figure 8B:
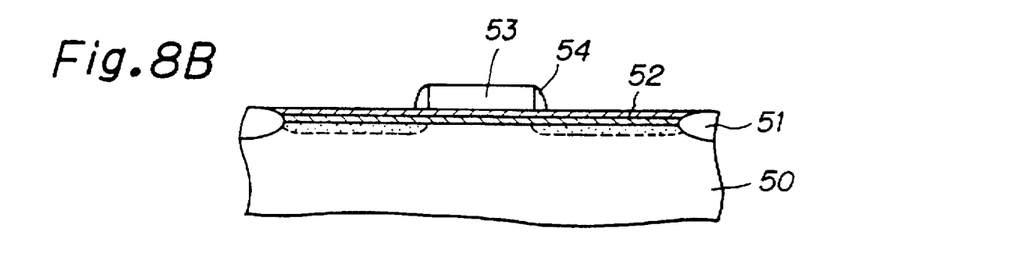
Figure 8C:
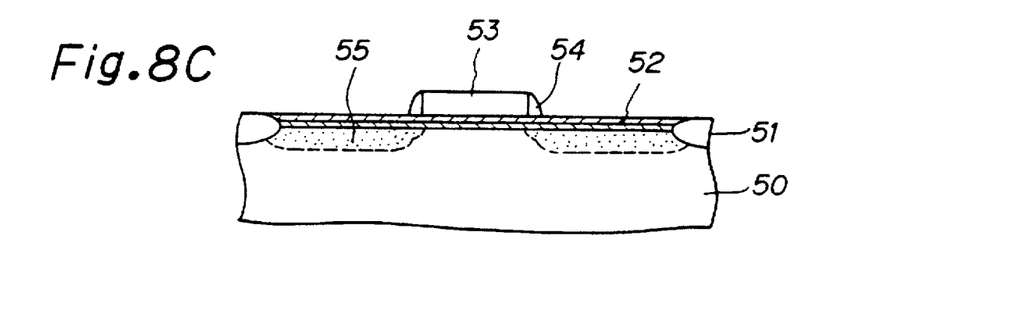

Next, activation processing is carried out by energy irradiation processing such as impurity ion injection or irradiation with a laser and a source/drain region 55 is formed (refer to FIG. 8(C)). [step 630]

Figure 8D:
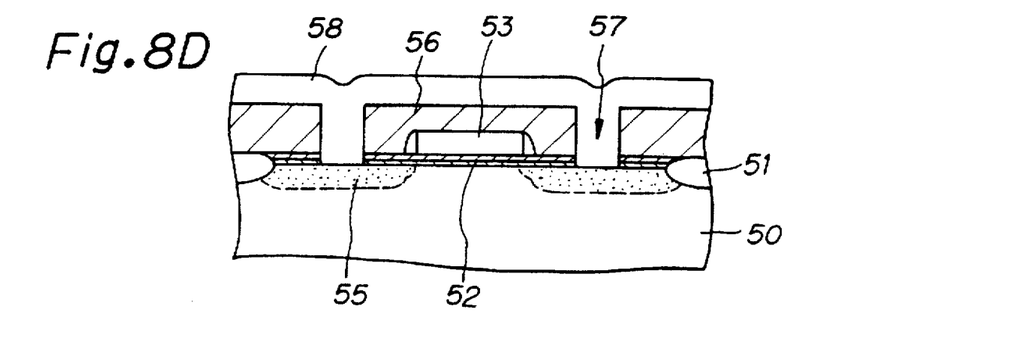

Next, an insulation layer 56 comprised of, for example, SiO2 is formed over the whole surface by a conventional insulation film-forming method or by an insulation film-forming method of the present invention. Openings 57 are then formed at the insulation layer 56 at the upper end of the source/drain region 55 using photolithographic or dry-etching techniques. Then, a metal wiring material comprising, for example, Al-1%Si is overlaid on the insulation layer 56 so as to include the inside of the openings 57 by a sputtering technique. the metal wiring material is then made into a pattern of the desired shape on the insulation layer 56 using photolithographic or dry-etching techniques and wiring 58 is formed and a MOS-type transistor of the structure shown in FIG. 8(D) is complete.

In the above, a description was given based on the preferred embodiments of the present invention but the present invention is by no means limited to these embodiments. Conditions and numeric values for each type described in the embodiments are shown as examples and can be modified appropriately. The design of the semiconductor device can also be modified in the appropriate manner as necessary.

Figure 9:
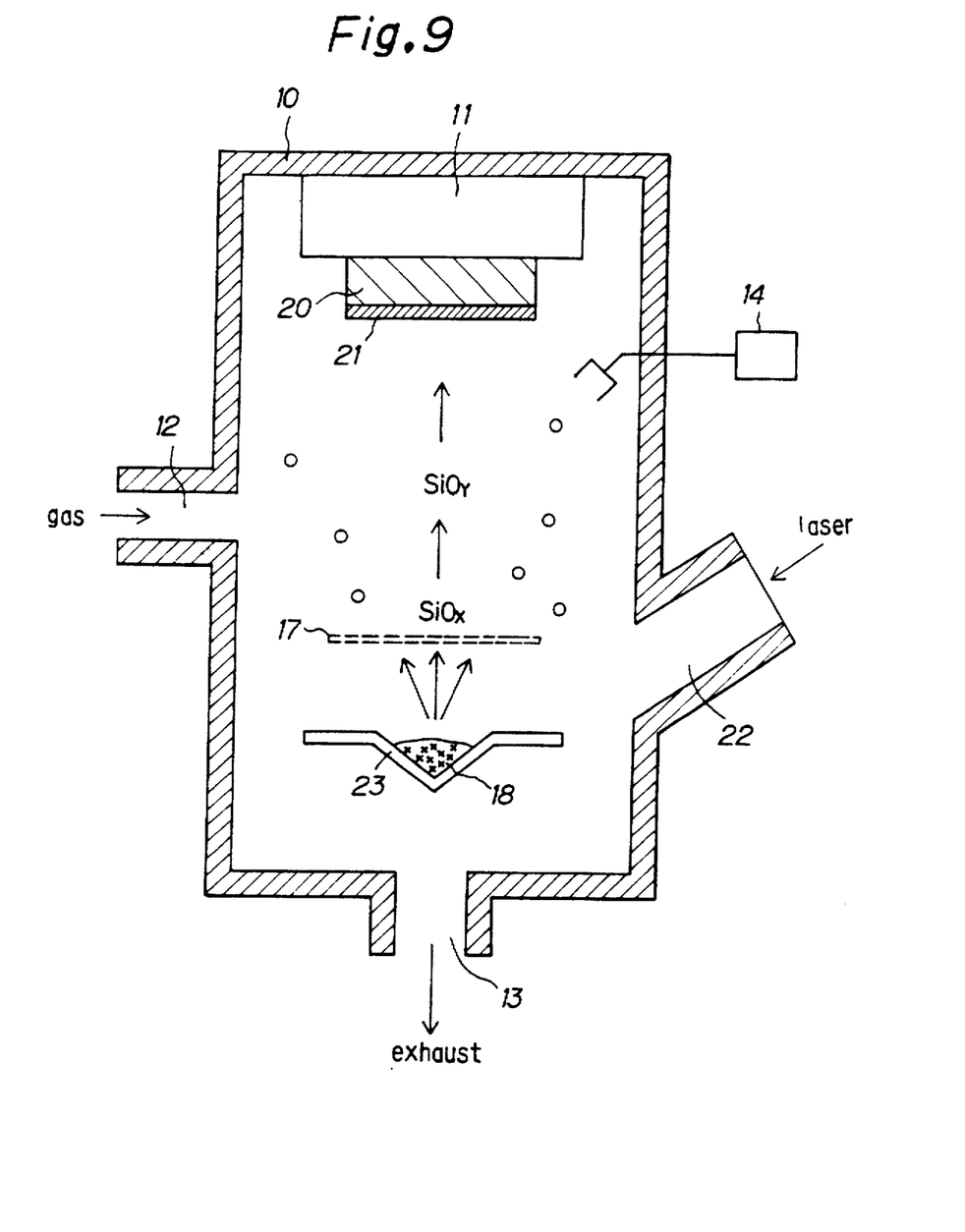
FIG. 9 is a view showing an outline of a film-forming device in addition to that of FIG. 1 suitable for forming the first insulation film of the present invention.

When forming the first insulation film it is also possible to heat and evaporate the silicon raw materials 18 by irradiation with a laser beam, as shown in FIG. 9. In FIG. 9, reference numeral 22 indicates a window which does not block the laser beam and 23 indicates a silicon raw material support. Heating of the silicon raw material can be localized using the laser beam and the generation of impurities from the silicon raw material support 23 can be avoided. i.e. the mixing of impurities with the first insulation film and accompanying deterioration of the characteristics of the first insulation film can be avoided.

Figure 10:
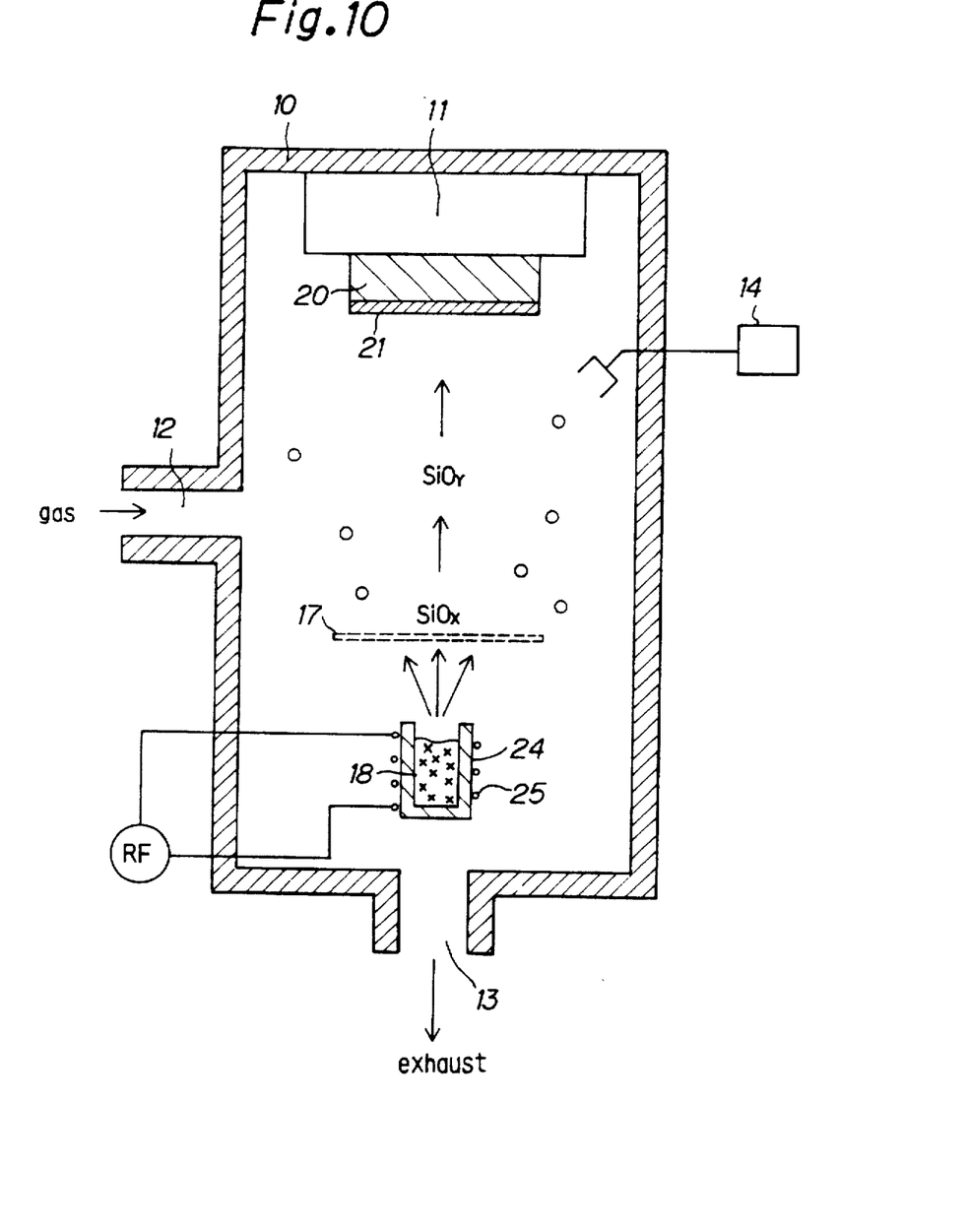
FIG. 10 is a view showing an outline of a film-forming device in addition to that of FIG. 9 suitable for forming the first insulation film of the present invention.

Alternatively, when forming the first insulation film, a ceramic container 24 can be used for housing the silicon raw materials 18, the ceramic container 24 can be heated by a high-frequency induction heating means 25 and the silicon raw material 18 can be made to evaporate. In this case, by using the ceramic container 24, the generation of metal impurities which accompanies the heating and evaporation of the silicon raw materials 18 can be avoided and metal impurities can be prevented from mixing in with the metal impurities.

It is also possible when forming the second insulation film to use, for example, TEOS (tetraethylorthosilicate)-O$_3$ or DADBA (diacetoxyditertiarybutoxysilane).

Figure 11:
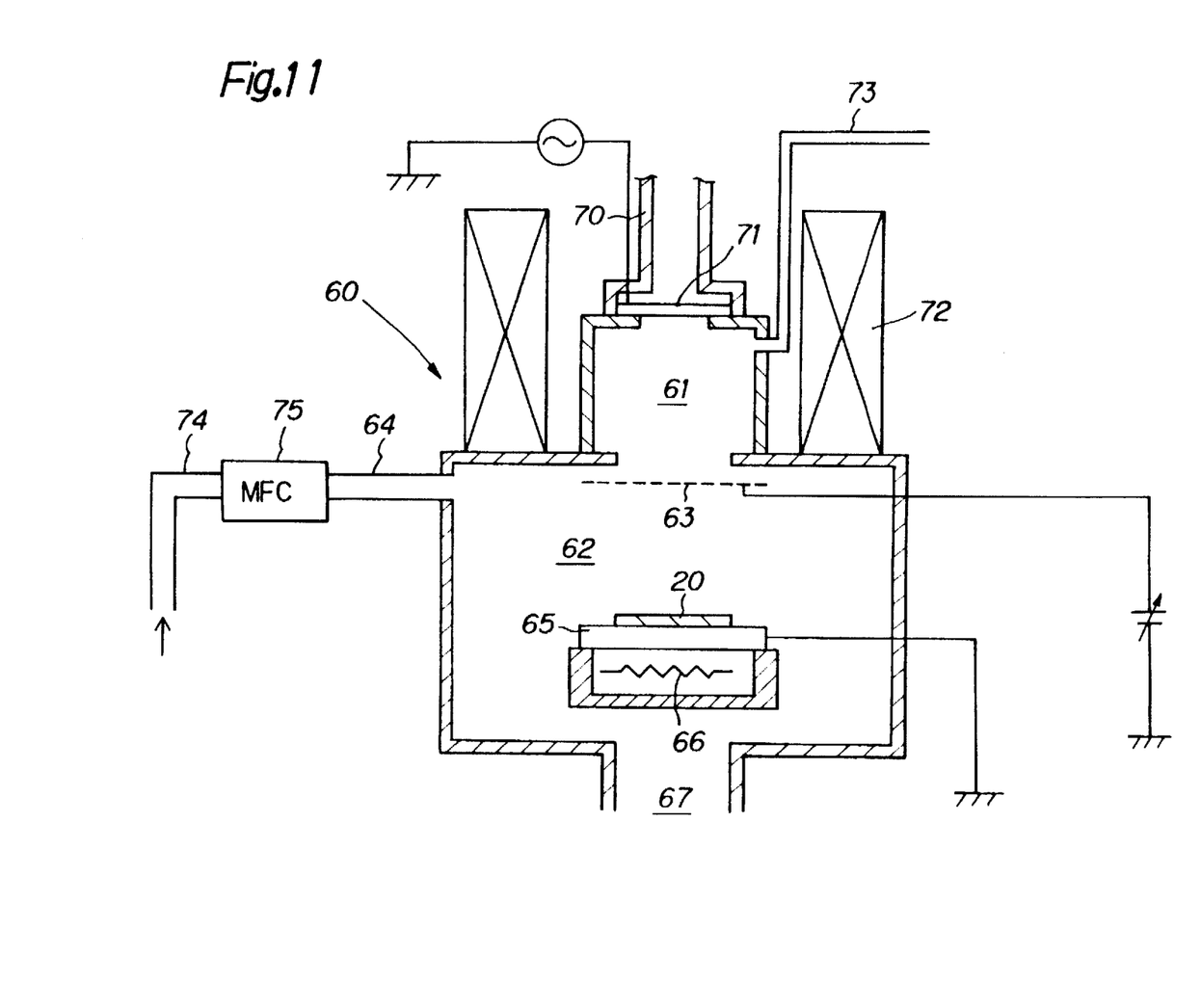
FIG. 11 is a view showing an outline of a remote ECR plasma-CVD device suitable for forming the second insulation film of the present invention.

The second insulation film may also be formed using a remote ECR plasma CVD device. An outline of this CVD device is shown in FIG. 11. A remote ECR plasma CVD device 60 is made up of a film-forming chamber 61 and a plasma chamber 62. The inlet portion of the film-forming chamber 61 and the outlet portion of the plasma chamber 62 communicate with each other, and a mesh electrode 63 having a multiplicity of openings is provided at this shared portion. A gas inlet 64 for CVD is provided at the film-forming chamber 61. In FIG. 11, reference numeral 20 indicates a board on which an insulation film is to be formed, numeral 65 indicates a board holder, numeral 66 indicates a heater for heating the board 20 and numeral 67 indicates a gas exhaust. A plasma chamber 62 is attached to one end of a waveguide 70 maintained at a vacuum and a microwave generating device (not shown in the drawings) is attached to the remaining end of the waveguide 70. Reference numeral 71 indicates a microwave inlet window. Microwaves generated by the microwave generating device pass through the waveguide 70 and the microwave inlet window 71 to be guided to the plasma chamber 62. A magnet 72 is positioned on the outside of the plasma chamber 62 and a divergent magnetic field is formed by the magnet 72. Gas (for example, oxygen or helium gas) for generating a plasma is introduced into the plasma chamber 62 from a plasma-generating gas inlet 73.

The plasma-generating gas is introduced into the plasma-generating chamber 62 from the plasma-generating gas inlet 73 and microwaves with a frequency of 2.45 GHz generated by the microwave generating device are introduced into the plasma chamber 62 via the waveguide 70 with the pressure within the plasma chamber 62 being $10^{-3}$ to $10^{-2}$ Pa. The microwaves are introduced parallel with respect to the magnetic flux. The microwaves may also be introduced vertical to the magnetic flux by changing the position of attachment of the waveguide 70. A magnetic flux density of 875 gauss is then given by the magnet 72 under ECR conditions and a plasma is generated. Ions and electrons possessing high energy are confined within the plasma chamber 62 because the mesh electrode 63 is provided and have difficulty in flowing through the film-forming chamber 61. On the other hand, neutral oxygen and helium radicals pass through the mesh electrode 63 and flow into the film-forming chamber 61.

The film-forming chamber 61 is equipped with a CVD gas inlet 64. A raw material gas for CVD (for example, $SiH_4$ or argon gas) is introduced into the film-forming chamber 61 via the gas inlet for CVD 64 from a gas providing system for CVD constructed from a gas source for CVD (not shown in the drawings), a gas pipe 74 and a flowmeter 75 comprising a mass flowmeter. The raw material gas for CVD is generated at the plasma chamber 62, dissolved by the plasma flow flowing through the mesh electrode 63 and then progresses onto the board 20. In this way, a second insulation film is formed on the board 20 using an ECR plasma CVD technique.

Not only can a remote plasma CVD device having mesh electrodes 42 and 63 or a remote ECR plasma CVD device be used, but also a CVD device having the plasma generating chamber 40 and the film-forming chamber 41 formed as separate rooms or having the plasma chamber 62 and the film-forming chamber 61 formed as separate chambers can be used, with the second insulation film then being formed by a remote plasma CVD technique or a remote ECR plasma CVD technique. Further, the second insulation film may also be formed using a plasma CVD device or ECR plasma CVD device with the mesh electrodes 42 and 63 removed from the remote plasma CVD device and the remote ECR plasma CVD device shown in FIG. 5 and FIG. 11. A magnetic field microwave plasma CVD device using 2.45 GHz microwaves or an LPCVD device may also be used. An example of the conditions in the case of forming a second insulation film using a microwave plasma CVD device is shown below.

Gas used: SiH4/N2O=5/100 sccm

RF power: 0.5 kW board temperature: 200° C.

pressure: 0.0001 Pa

Forming can also be carried out using a sputtering device with $SiO_2$ taken as a target using an RF magnetron sputtering technique taking $O_2$ and Ar as a process gas.

According to the present invention, by forming a first insulation film and a second insulation film comprised of silicon dioxide using two stages of a first insulation film-forming step and a second insulation film-forming step the overall insulation film has superior characteristics where the surface boundary level density (fault density) is low, charge traps are few and voltage resistance is high. Further, a first insulation film having superior characteristics can be formed on a board comprised of a glass substrate etc. of a comparatively low melting point without damaging the board. Moreover, damage to the board can be avoided because the first insulation film can be formed without the need of the high energy of, for example, a plasma.

If low melting-point silicon monoxide (SiO) is used as the silicon raw material, silicon material can be made to evaporate using little electrical power by using resistive heating or inductive heating techniques. The temperature for forming the insulation film can be made to be a low temperature by adopting a plasma CVD technique or an ECR plasma CVD technique and further by adopting a remote plasma CVD technique or a remote ECR plasma CVD technique while the second insulation film is being formed.

According to the semiconductor device and manufacturing method of the present invention, the occurrence of faults at the surface boundary of the first insulation film and the board can be suppressed. Semiconductor devices may therefore be provided having a large degree of carrier shifting and low threshold voltage.

What is claimed is:

1. An interlevel dielectric or gate oxide film-forming method comprising the steps of:

heating and evaporating silicon raw materials comprising SiOx (provided that $0 \leq X \leq 1.8$);

vapor phase reacting the evaporated silicon raw materials and a gas including oxygen, and generating silicon dioxide;

adhering the silicon dioxide to a substrate surface, and forming a first film comprising silicon dioxide on the surface of the substrate; and forming a second film comprising silicon dioxide on the first film by a chemical vapor phase growth technique or sputter technique.

2. An interlevel dielectric or gate oxide film-forming method according to claim 1, wherein the partial pressure of the gas including oxygen is from $1.3 \times 10^{-3}$ to 1.3 Pa and the temperature of the substrate when the first film is formed is from 0° to 900° C.

3. An interlevel dielectric or gate oxide film-forming method according to claim 1, wherein the chemical vapor phase growth technique is a plasma CVD technique or a remote plasma technique and the temperature of the substrate when the second film is formed is from 0° to 450° C.

4. An interlevel dielectric or gate oxide film-forming method according to claim 1, wherein the chemical vapor phase growth technique is an ECR plasma CVD technique or a remote ECR plasma CVD technique and the temperature of the substrate when the second insulation film is formed is from 0° to 450° C.

5. An interlevel dielectric or gate oxide film-forming method comprising the steps of:

heating and evaporating silicon raw materials comprising SiOx (provided that $0 \leq X \leq 1.8$);

vapor phase reacting the evaporated silicon raw materials and a gas including oxygen, and generating silicon dioxide;

adhering the silicon dioxide to a substrate surface, and forming a first film comprising silicon dioxide on the surface of the substrate; and forming a second film comprising silicon dioxide on the first film by a chemical vapor phase growth technique or a sputter technique and wherein the second film comprises silicon dioxide having a higher voltage resistance than the SiOx first layer.

6. An interlevel dielectric or gate oxide film-forming method comprising the steps of:

heating and evaporating silicon raw materials comprising SiOx (provided that $0 \leq X \leq 1.8$);

vapor phase reacting the evaporated silicon raw materials and a gas including oxygen, and generating silicon dioxide;

adhering the silicon dioxide to a substrate surface, and forming a first film comprising silicon dioxide on the surface of the substrate; and (B) immediately thereafter forming a second insulation film comprising silicon dioxide on the first film by a chemical vapor phase growth technique or a sputter technique on the first layer.

* * * * *